US012568797B2

(12) United States Patent　　　　　(10) Patent No.:　US 12,568,797 B2

Exley et al.　　　　　　　　　　　　(45) Date of Patent:　　Mar. 3, 2026

(54) PASSIVE SEPARATION CASSETTE AND CARRIER

(71) Applicant: Applied Materials, Inc., Santa Clara, CA (US)

(72) Inventors: James B. Exley, Jarrell, TX (US); Ross Bandy, Milton, MA (US); James D. Strassner, Austin, TX (US)

(73) Assignee: Applied Materials, Inc., Santa Clara, CA (US)

( * ) Notice: Subject to any disclaimer, the term of this patent is extended or adjusted under 35 U.S.C. 154(b) by 546 days.

(21) Appl. No.: 18/073,229

(22) Filed: Dec. 1, 2022

(65) Prior Publication Data

US 2024/0186166 A1　　Jun. 6, 2024

(51) Int. Cl.
H01L 21/677　　　(2006.01)
H01L 21/687　　　(2006.01)

(52) U.S. Cl.
CPC .. H01L 21/67742 (2013.01); H01L 21/67754 (2013.01); H01L 21/68707 (2013.01)

(58) Field of Classification Search
CPC ......... H01L 21/67754; H01L 21/67742; H01L 21/68707; H01L 21/67346; H01L 21/67353; H01L 21/67369; H01L 21/67748; H01L 21/67766; H01L 21/67796; H01L 21/68; H01L 21/681; H01L 21/682; H01L 21/68714; H01L 21/68764
See application file for complete search history.

(56) References Cited

U.S. PATENT DOCUMENTS

| | | | | | |
|---|---|---|---|---|---|
| 5,697,748 | A | * | 12/1997 | Somekh | ............ H01L 21/67739 |
| | | | | | 414/217 |
| 6,441,899 | B1 | * | 8/2002 | Blaesing-Bangert | ........................ |
| | | | | | H01L 21/67346 |
| | | | | | 356/244 |
| 7,740,437 | B2 | * | 6/2010 | De Ridder | ........ H01L 21/67769 |
| | | | | | 414/940 |
| 2003/0175097 | A1 | * | 9/2003 | Lee | .................... H01L 21/67766 |
| | | | | | 414/222.01 |
| 2009/0060690 | A1 | * | 3/2009 | Sagun | ............... H01L 21/67742 |
| | | | | | 414/222.01 |
| 2011/0049087 | A1 | * | 3/2011 | Ferguson | .............. B25B 11/002 |
| | | | | | 29/559 |
| 2011/0076117 | A1 | * | 3/2011 | Iizuka | ............... H01L 21/67748 |
| | | | | | 414/217 |
| 2017/0358479 | A1 | * | 12/2017 | Morikawa | ........ H01L 21/68707 |
| 2020/0144097 | A1 | * | 5/2020 | Thaulad | ............ H01L 21/67766 |

(Continued)

*Primary Examiner* — Glenn F Myers

(74) *Attorney, Agent, or Firm* — Nields, Lemack & Frame, LLC

(57)　　　　　　ABSTRACT

A system for holding and transporting one or more workpieces is disclosed. The system includes a cassette that is configured to support a carrier and a workpiece at two different elevations. In this way, as the carrier with the workpiece is placed on the cassette by a first robot, the carrier moves down further, as the workpiece is supported by taller support posts. The end effector of a second robot may then later remove only the workpiece from the cassette for processing. The processed workpiece is later placed back in the cassette by the second robot. This processed workpiece is then removed, along with the carrier, by the first robot. Carriers may be created to accommodate different sized workpieces such that the cassette remains unchanged.

23 Claims, 10 Drawing Sheets

(56)　　　　　References Cited

U.S. PATENT DOCUMENTS

2020/0161161 A1 *　5/2020　Wu ........................ H01L 21/681
2020/0335312 A1 *　10/2020　Kopec ............... H01L 21/68707
2021/0347584 A1 *　11/2021　Hashima ................. G03F 7/162

* cited by examiner

PASSIVE SEPARATION CASSETTE AND CARRIER

FIELD

Embodiments relate to a system for allowing different sized workpieces to be processed using a common cassette and carrier.

BACKGROUND

Ions are used in a plurality of semiconductor processes, such as implantation, amorphization, deposition and etching processes. These semiconductor processes are typically performed in a process chamber, which is maintained at near vacuum conditions.

To be processed, a semiconductor workpiece is transported from an ambient environment to the process chamber. Further, after being transported to the process chamber, the semiconductor workpiece is typically handled by one or more robots.

These robots typically have end effectors which are used to pick up and place workpieces on other surfaces. These surfaces may include an orientation station, a platen, or an intermediate transfer station. For example, a transfer station may include a cassette that is used to hold one or more workpieces placed by a first robot, and then move to another location, where a second robot removes these workpieces. Processed workpieces then placed in the cassette by the second robot and returned to the first robot.

Often, the robots and transfer stations are dimensioned to accommodate a particular sized workpiece, such as a 300 mm diameter workpiece.

However, in certain embodiments, there may be a desire to process a differently sized workpiece using the same equipment. This workpiece may be smaller than the size for which the system was designed.

Therefore, it would be beneficial if there was a system that allowed different sized workpieces to be transported by the robots and the transfer stations. Further, it would be advantageous if this system was easily modified to accommodate the different sized workpiece.

SUMMARY

A system for holding and transporting one or more workpieces is disclosed. The system includes a cassette that is configured to support a carrier and a workpiece at two different elevations. In this way, as the carrier with the workpiece is placed on the cassette by a first robot, the carrier is separated from the workpiece, as the workpiece is supported by taller support posts. The end effector of a second robot may then later remove only the workpiece from the cassette for processing. The processed workpiece is later placed back in the cassette by the second robot. This processed workpiece is then removed, along with the carrier, by the first robot. Carriers may be created to accommodate different sized workpieces such that the cassette is unchanged.

According to one embodiment, a workpiece transfer apparatus is disclosed. The workpiece transfer apparatus comprises a cassette, having an arm having a plurality of carrier support posts and a plurality of workpiece support posts that are taller than the plurality of carrier support posts. In some embodiments, the cassette comprises at least one additional arm having the plurality of carrier support posts and the plurality of workpiece support posts.

According to another embodiment, a workpiece transfer system is disclosed. The workpiece transfer system comprises the workpiece transfer apparatus described above and a carrier, adapted to hold a workpiece, wherein the carrier is larger than the workpiece, and wherein the carrier comprises holes passing therethrough corresponding to locations of each of the plurality of workpiece support posts. In some embodiments, the carrier comprises alignment tabs on a top surface, so as to retain the workpiece in a fixed location. In some embodiments, the carrier is disk shaped. In some embodiments, the carrier has a dimension equal to a largest workpiece supported by the arm. In some embodiments, the carrier is made from silicon. In some embodiments, the carrier is made from glass.

According to another embodiment, a system for transporting and processing a workpiece is disclosed. The system comprises a first robot having a first end effector; a workpiece transfer apparatus, comprising a cassette, having an arm having a plurality of carrier support posts and a plurality of workpiece support posts that are taller than the plurality of carrier support posts; a carrier, adapted to hold a workpiece, wherein the carrier is larger than the workpiece, and wherein the carrier comprises holes passing therethrough corresponding to locations of each of the plurality of workpiece support posts; and a second robot having a second robot end effector, wherein the first robot and the second robot place and remove workpieces from the workpiece transfer apparatus. In some embodiments, the first end effector has a different shape than the second robot end effector, and the plurality of workpiece support posts are positioned on the arm such that the first end effector and the second robot end effector are capable of placing and removing the workpiece from the arm without contacting the plurality of workpiece support posts. In some embodiments, the first end effector accesses the workpiece e from a different direction than the second robot end effector, and the plurality of workpiece support posts are positioned on the arm such that the first end effector and the second robot end effector are capable of placing and removing the workpiece from the arm without contacting the plurality of workpiece support posts. In some embodiments, the system comprises semiconductor processing equipment accessible by the second robot, wherein the semiconductor processing equipment comprises a platen. In some embodiments, the cassette has a second arm, comprising the plurality of carrier support posts and the plurality of workpiece support posts. In some embodiments, the first robot has a second end effector, and the first robot removes a first carrier with a processed workpiece disposed thereon from the arm using the first end effector and places a second carrier with an unprocessed workpiece disposed thereon on the second arm using the second end effector. In some embodiments, the system comprises an orientation station, wherein, during steady state operation, the second robot performs a sequence of operations, comprising: retaining an unoccupied carrier with the second robot end effector waiting for the cassette to arrive; placing the unoccupied carrier on the second arm; removing a new workpiece from the arm and transferring the new workpiece to the orientation station; moving to the platen; removing a processed workpiece from the platen; returning the processed workpiece to the second arm; and removing a carrier disposed on the arm. In some embodiments, before removing the carrier disposed on the arm, the sequence of operations further comprises: moving to the orientation station; removing an aligned workpiece; and moving the aligned workpiece to the platen. In certain embodiments, during steady state operation, the second robot performs a sequence of operations, comprising: retaining an unoccupied carrier with the second robot end effector waiting for the cassette to arrive; placing the unoccupied carrier on the second arm; moving to the platen; removing a processed workpiece from the platen; returning the processed workpiece to the second arm; removing a new workpiece from the arm and transferring the new workpiece to the platen; and removing a carrier disposed on the arm.

According to another embodiment, a system for transporting and processing a workpiece is disclosed. The system comprises a robot; a workpiece transfer apparatus, comprising a cassette, having an arm having a plurality of carrier support posts and a plurality of workpiece support posts that are taller than the plurality of carrier support posts; a carrier, adapted to hold a workpiece, wherein the carrier is larger than the workpiece, and wherein the carrier comprises holes passing therethrough corresponding to locations of each of the plurality of workpiece support posts; semiconductor processing equipment; and a second robot, wherein the first robot utilizes the carrier to transport workpieces to and from the workpiece transfer apparatus and the second robot transports workpieces to and from the semiconductor processing equipment without the carrier. In some embodiments, the carrier is disk shaped. In certain embodiments, the carrier has a dimension equal to a largest workpiece used in the workpiece transfer apparatus.

BRIEF DESCRIPTION OF THE FIGURES

For a better understanding of the present disclosure, reference is made to the accompanying drawings, which are incorporated herein by reference and in which.

DETAILED DESCRIPTION

Figure 1:
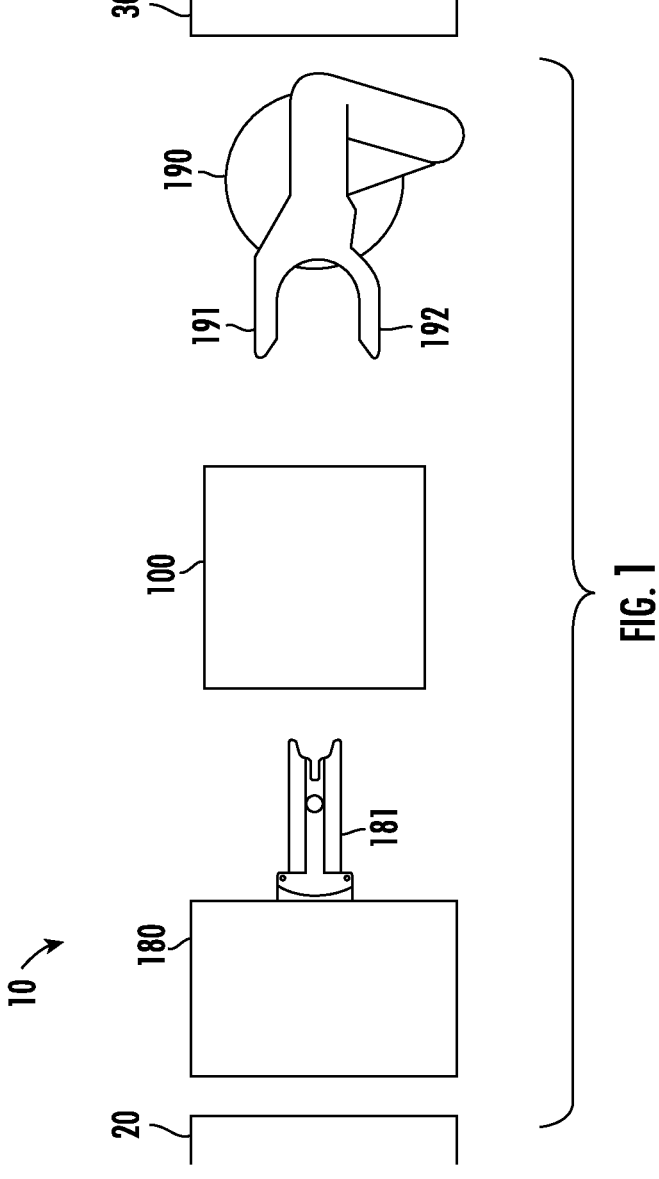
FIG. 1 shows a system for transporting and processing workpieces according to one embodiment.

FIG. 1 shows one embodiment of a system 10 for transporting workpieces for use in a semiconductor processing system. The system 10 includes a first robot 180, a second robot 190, and a workpiece transfer apparatus 100. The system may also include a source of new workpieces, such as a load lock 20, which may be accessible to the first robot 180. Additionally, one or more semiconductor processing equipment 30 may be accessible to the second robot 190. The semiconductor processing equipment 30 may be any equipment capable of processing a workpiece, such as an ion implanter, an etch tool, a deposition tool, or a chemical mechanical planarization (CMP) tool to name a few. In operation, new workpieces are transferred from the load lock 20 to the workpiece transfer apparatus 100 by the first robot 180. The workpieces are then transferred from the workpiece transfer apparatus 100 to the semiconductor processing equipment 30 by the second robot 190. Processed workpieces are then returned from the semiconductor processing equipment to the load lock 20 using the reverse order of operations.

The first robot 180 includes a first end effector 181. The first end effector 181 may be configured to hold a single workpiece, such as a workpiece having a 300 mm diameter. The second robot 190 includes a second robot end effector 191, which may have a "Y" configuration, such that the second robot end effector 191 splits into two prongs 192 which support the workpiece.

Figure 2:
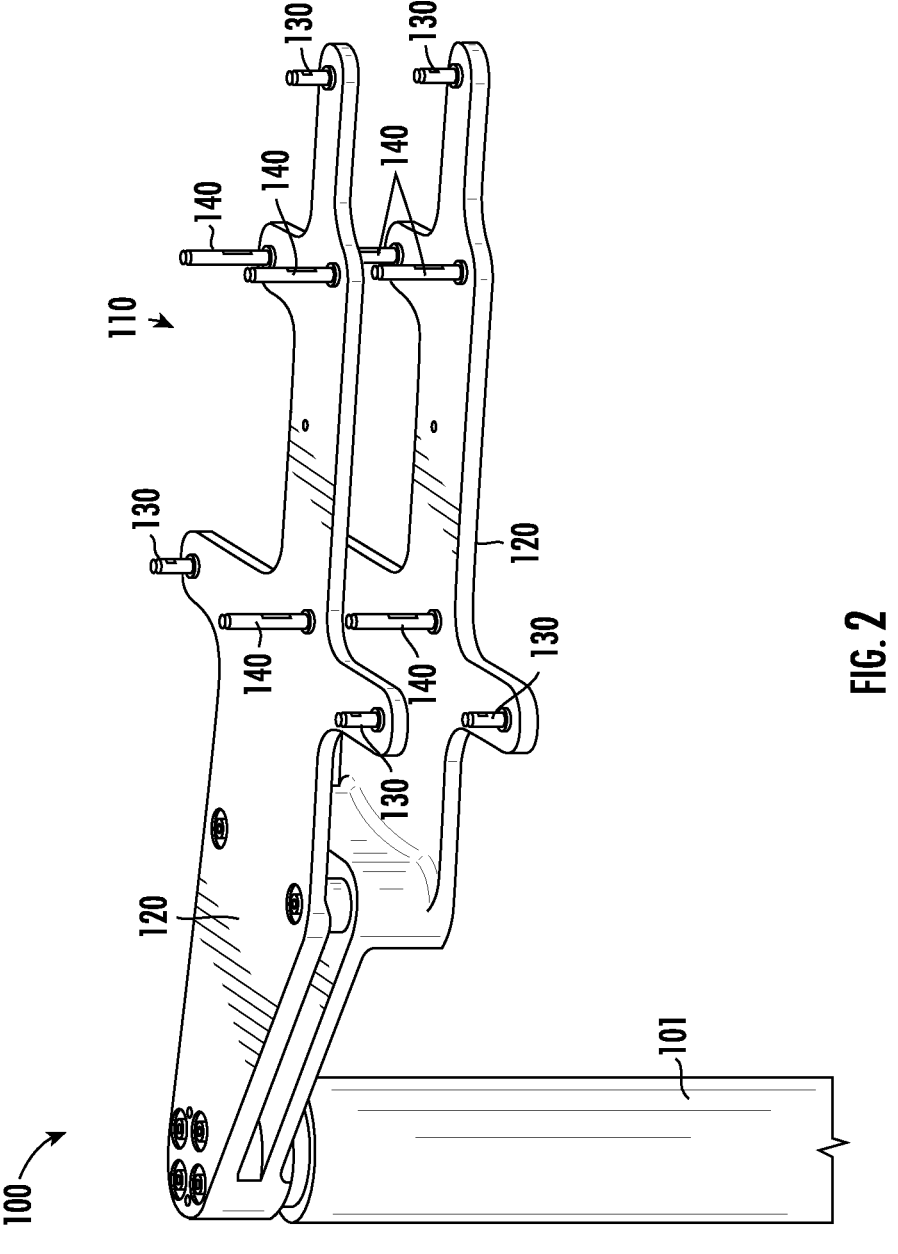
FIG. 2 shows the workpiece transfer apparatus according to one embodiment.

The workpiece transfer apparatus 100 is shown in FIG. 2. The workpiece transfer apparatus includes a shaft 101, which may be capable of movement in the vertical direction. This may be referred to as an elevator shaft. A cassette 110 is attached to the shaft 101. The cassette 110 may comprise one or more arms 120. In FIG. 2, there are two arms, however, in other embodiments, there may be one arm or more than two arms. The arms 120 are spaced apart, as described in more detail below. Each arm 120 comprises a plurality of carrier support posts 130. Each arm 120 also comprises a plurality of workpiece support posts 140. The plurality of workpiece support posts 140 are positioned so as to stably support a workpiece. In certain embodiments, there are three or more carrier support posts 130 and three or more workpiece support posts 140 on each arm 120. Each of the carrier support posts 130 has the same height. Similarly, each of the workpiece support posts 140 has the same height, which is taller than the carrier support posts 130. The locations of the carrier support posts 130 and the workpiece support posts 140 may be the same for each arm 120.

Figure 3A:
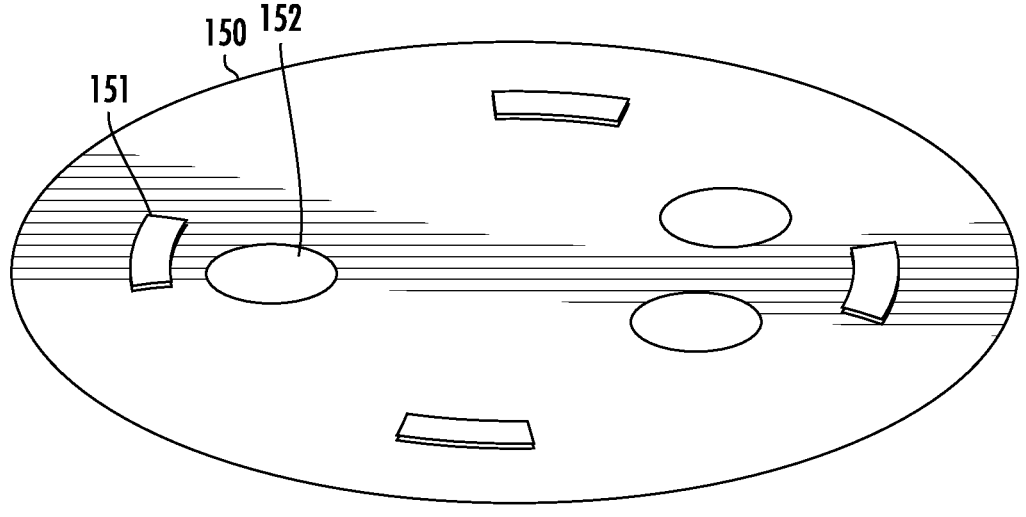
FIGS. 3A-3B show a carrier without a workpiece and with a workpiece, respectively.
Figure 3B:
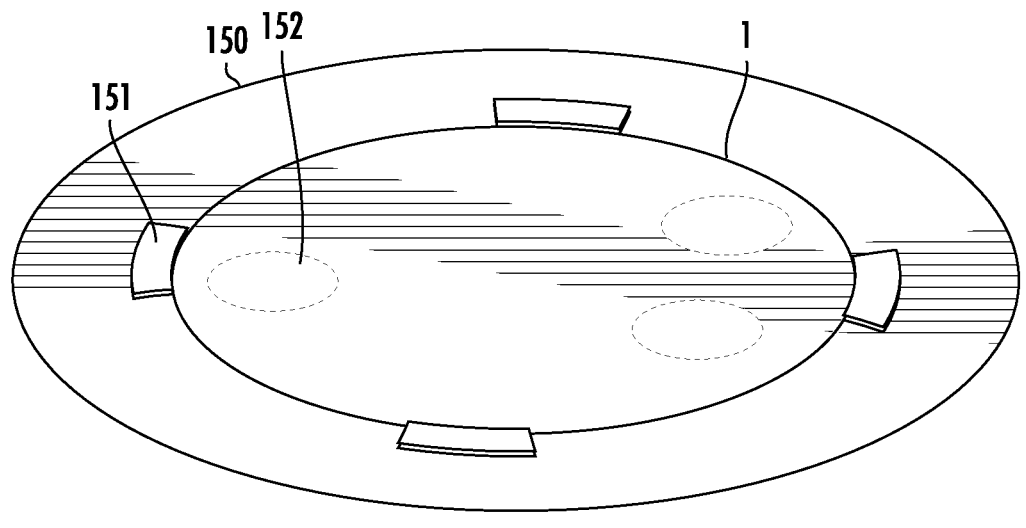

FIGS. 3A-3B show a carrier 150 that is used in conjunction with the workpiece transfer apparatus 100 to form a workpiece transport system. FIG. 3A shows the carrier 150 alone, while FIG. 3B shows the carrier 150 with a workpiece 1 disposed on the top surface of the carrier 150. The carrier 150 may be disk shaped. The diameter of this disk may be equal to the largest workpiece that is used in the workpiece transfer apparatus 100 and supported by the arm 120. For example, in certain embodiments, the carrier 150 may be disk shaped with a diameter of 300 mm.

Multiple alignment tabs 151 may protrude from the top surface of the carrier 150. The alignment tabs 151 are positioned such that a workpiece 1, which is smaller than the carrier 150, is nestled between the alignment tabs 151, as shown in FIG. 3B. Further, the carrier 150 comprises a plurality of holes 152 passing therethrough, which correspond to the locations of the workpiece support posts 140. In some embodiments, the diameter of the holes 152 is several times larger than the diameter of the workpiece support posts 140. For example, the diameter of the holes 152 may be at least 3 times larger than the diameter of the workpiece support posts 140. In one particular embodiment, the diameter of the holes 152 may be 6 times larger than the diameter of the workpiece support posts 140. This allows the carrier 150 to be placed on the arm 120 without precise orientation of the carrier 150 to the arm 120. In some embodiments, the carrier 150 with the workpiece disposed thereon may be oriented prior to being accessible to the first robot 180. In other embodiments, the carrier 150 without the workpiece may be oriented prior to being accessible to the first robot 180.

In certain embodiments, the carrier 150 is made from the same material as the workpiece 1. For example, in one embodiment, the carrier 150 may be made from a silicon wafer. In another embodiment, the carrier 150 may be made from glass or another suitable material.

Figure 4A:
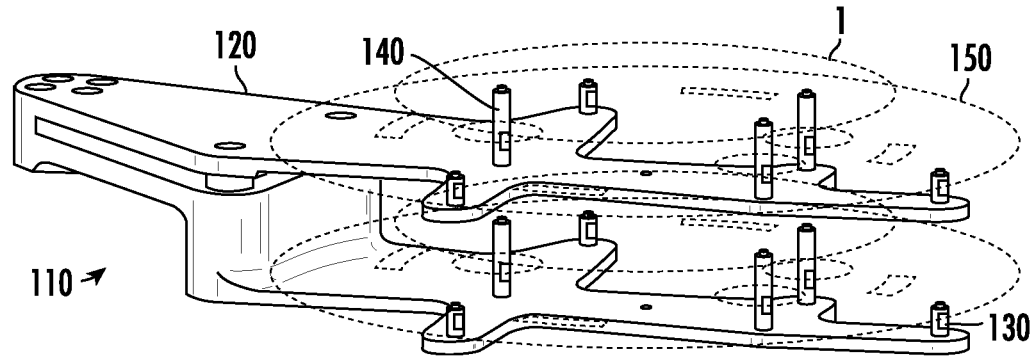
FIGS. 4A-4B show the cassette loaded with workpieces and carrier.
Figure 4B:
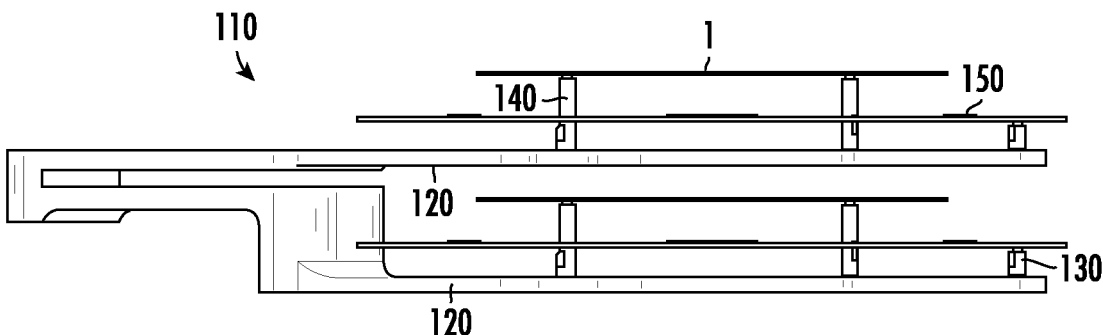

FIGS. 4A-4B show a perspective view and a side view, respectively of the workpiece transfer apparatus 100, which includes the cassette 110 and the carrier 150. Note that when the carrier 150 is placed on the arm 120, the holes 152 correspond to the workpiece support posts 140, allowing the carrier 150 to continue moving downward to rest on the carrier support posts 130. In contrast, the workpiece 1 rests on the taller workpiece support posts 140. Thus, the plurality of workpiece support posts 140 and carrier support posts 130 provide a multi-level configuration, where the carrier 150 is disposed at a first height and the workpiece 1 is disposed at a second height, which is above the carrier 150. In some embodiments, the workpiece, when resting on the workpiece support posts 140, may be disposed about 1.25 to 1.5 inches above the arm 120 of the cassette 110. In certain embodiments, the carrier 150, when resting on the carrier support posts 130 may be positioned roughly halfway between the workpiece and the arm 120.

The height of the carrier support posts 130 is defined such that the first end effector 181 and the second robot end effector 191 can each individually fit between the top surface of the arm 120 and the bottom surface of a carrier 150 that is disposed on the carrier support posts 130. Similarly, the height of the workpiece support posts 140 is defined such that the first end effector 181 and the second robot end effector 191 can each individually fit between top surface of the carrier 150 and the bottom surface of the workpiece 1.

In certain embodiments, the shape of the first end effector 181 may be different from the shape of the second robot end effector 191. Additionally, as shown in FIG. 5, the direction from which the first end effector 181 accesses the workpiece 1 may be different from the direction from which the second robot end effector 191 accesses the workpiece 1.

Figure 5A:
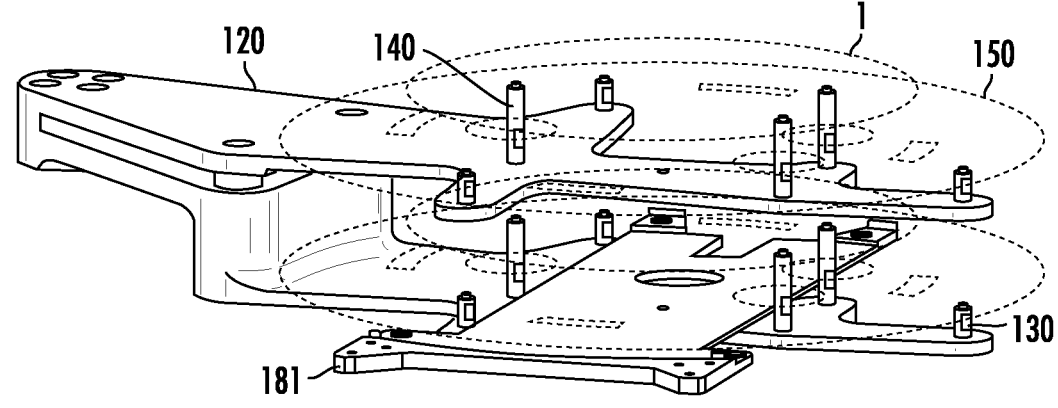
FIGS. 5A-5C show the interaction between the cassette and the two robots.
Figure 5B:
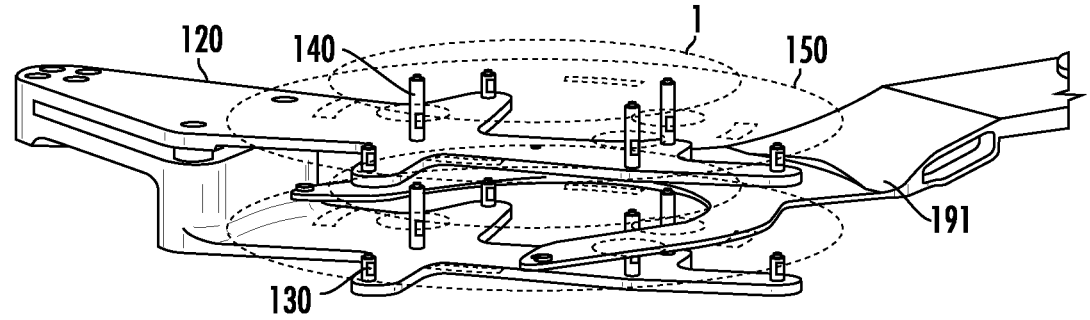
Figure 5C:
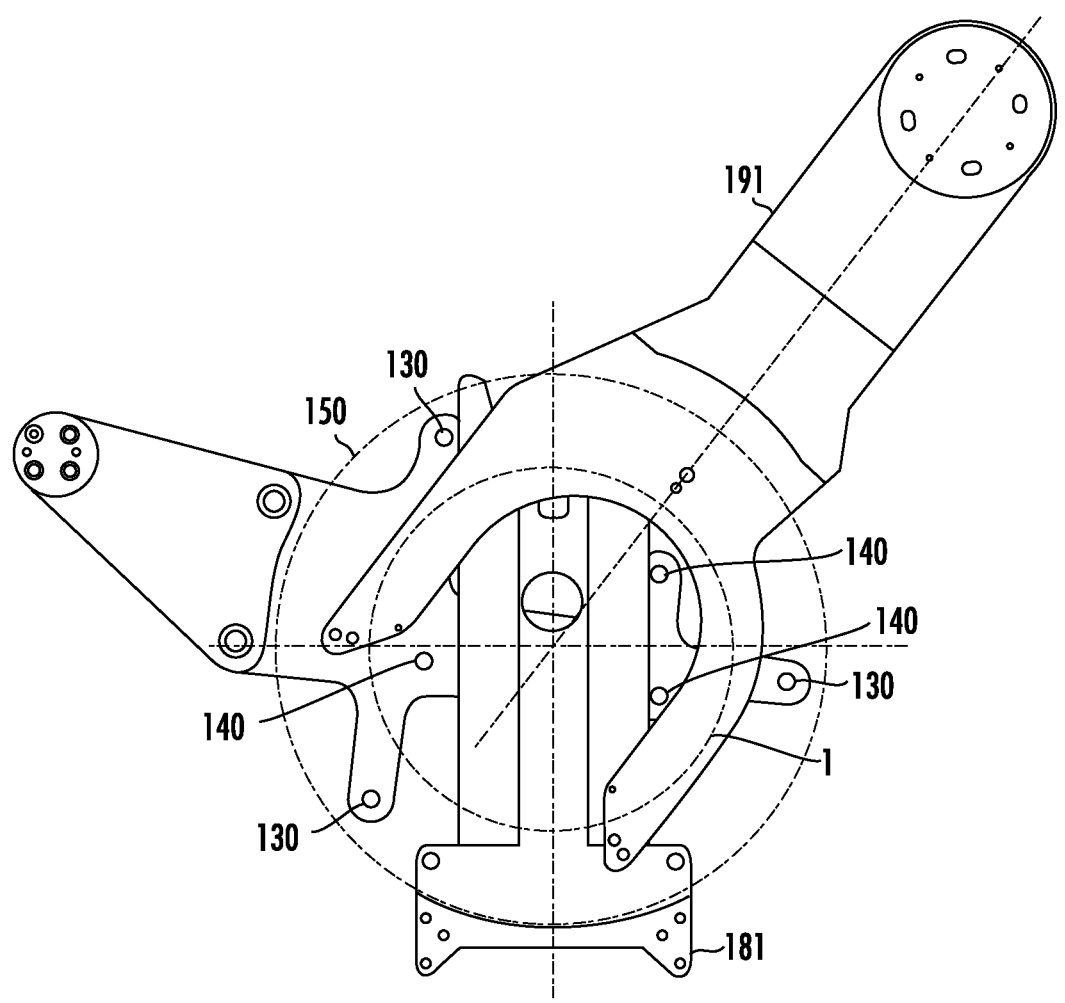

FIGS. 5A-5C show an example where the first end effector 181 is a solid piece, while the second robot end effector 191 has a Y configuration. Additionally, the directions from which each end effector accesses the workpiece is different. In FIG. 5A, the first end effector 181 is accessing the workpiece 1, while in FIG. 5B, the second robot end effector 191 is accessing the workpiece 1. FIG. 5C shows a top view that shows both end effectors in their extended positions. Note that this configuration does not occur in actuality, rather, the end effectors are both shown to demonstrate the placement of the carrier support posts 130 and the workpiece support posts 140. Note that the posts are positioned such that they do not contact either end effector.

Figure 6:
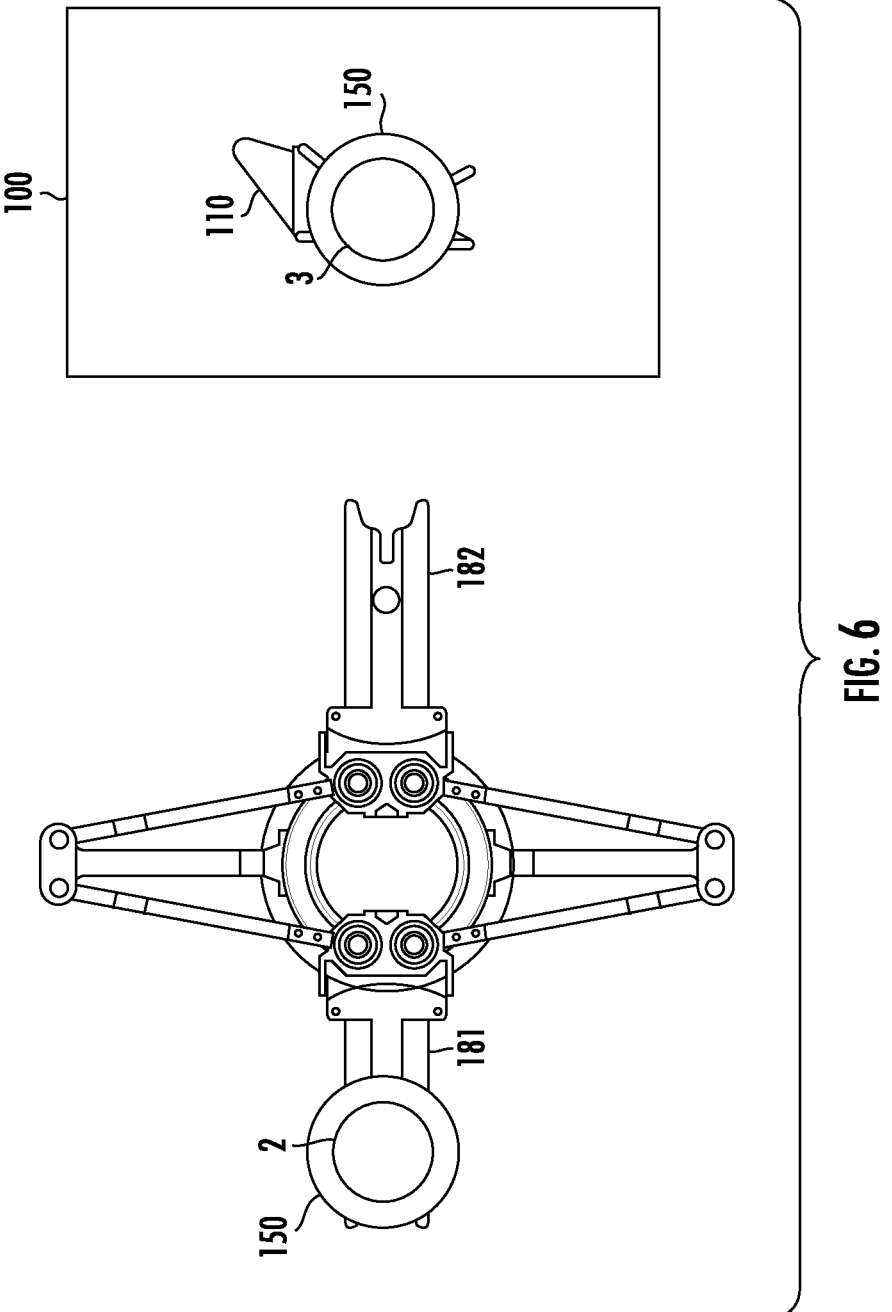
FIG. 6 shows the first robot and the workpiece transfer apparatus according to one embodiment.

In one particular embodiment, the first robot 180 may be in communication with a load lock 20 or similar component, and have two end effectors, the first end effector 181, and a second end effector 182, which can extend and retract radially, as shown in FIG. 6. Further, the first robot 180 may rotate.

The cassette 110 is mounted on a shaft 101 capable of vertical movement. This may be an elevator shaft. In this way, the height of the cassette 110 may be varied.

During steady state operation, the first robot 180 may be exchanging processed workpieces and new workpieces. For example, the first end effector 181 may have a new workpiece 2, retrieved from a load lock 20 or other source. The second end effector 182 may be empty.

The loading and unloading process begins with first robot 180 extending the second end effector 182 into the cassette 110, where a processed workpiece 3 and its associated carrier 150 are located. The second end effector 182 is inserted between the carrier 150 and the arm 120. After the second end effector 182 is extended, the cassette 110 is moved downward. This causes the carrier 150 to contact the second end effector 182. As the cassette 110 continues to move downward, the processed workpiece 3 contacts the carrier 150. The second end effector 182 then retracts, removing the processed workpiece 3 and its associated carrier 150.

The first robot 180 then rotates such that the first end effector 181 faces the workpiece transfer apparatus 100. The first end effector 181 then extends into the cassette 110. The cassette 110 is then moved upward. The new workpiece 2 then rests on the workpiece support posts 140. As the cassette 110 continues moving upward, the carrier 150 rests on the carrier support posts 130. Once the carrier 150 is separated from the first end effector 181, the first end effector 181 may be retracted. During this time, the second end effector 182 may return the processed workpiece 3 and its associated carrier 150 to the load lock 20.

Further, in some embodiments, the workpiece transfer apparatus 100 may have a cassette 110 with two arms 120, so as to support two workpieces. In this way, one arm may be used for new workpieces while the second arm may be used for processed workpieces.

Note that when the cassette 110 has at least two arms 120, the order of operations described above may be reversed. In other words, the new workpiece 2 may be placed in the workpiece transfer apparatus 100 prior to removing the processed workpiece 3.

Note that this same process may be used for workpieces that do not utilize a carrier. Thus, the use of this carrier 150 and cassette 110 eliminates any reprogramming of the first robot 180 based on workpiece diameter.

Figure 7:
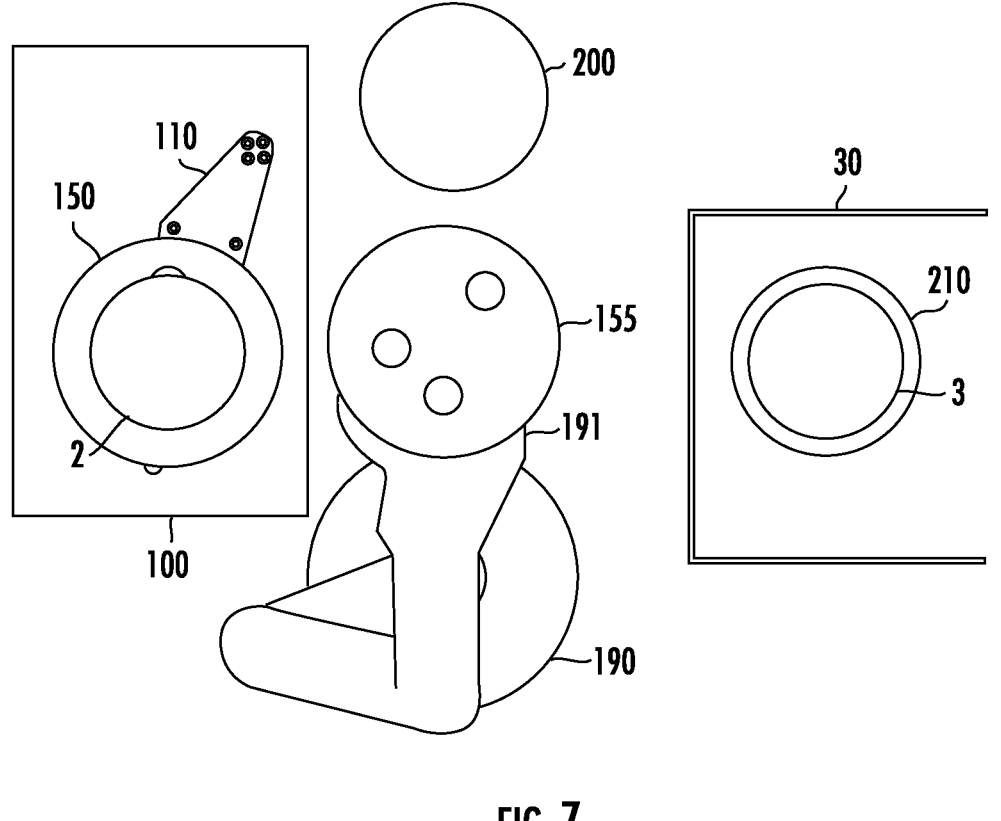
FIG. 7 shows the second robot and the workpiece transfer apparatus according to one embodiment.

As shown in FIG. 7, the second robot 190 may be located at a different height and may have a single second robot end effector 191. This second robot 190 may be a SCARA (Selective Compliance Articulated Robotic Arm) type robot, capable of movement in the radial direction and rotation in the yaw direction. The second robot 190 may be disposed in an upper chamber where it is able to access the workpiece transfer apparatus 100, an orientation station 200 and a platen 210. The platen 210 may be part of some semiconductor processing equipment 30, such as an ion implanter, an etch tool, a deposition tool, or a chemical mechanical planarization (CMP) tool.

Figure 8:
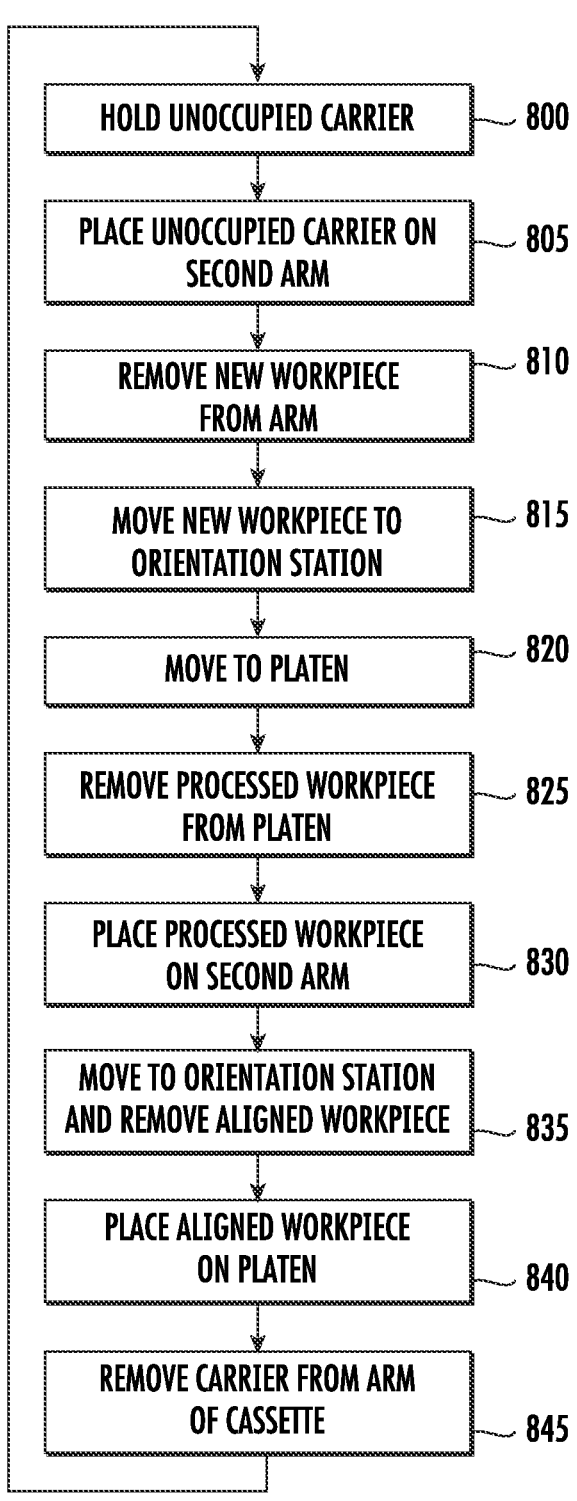
FIG. 8 shows the sequence of operations performed by the second robot according to one embodiment.
Figure 9:
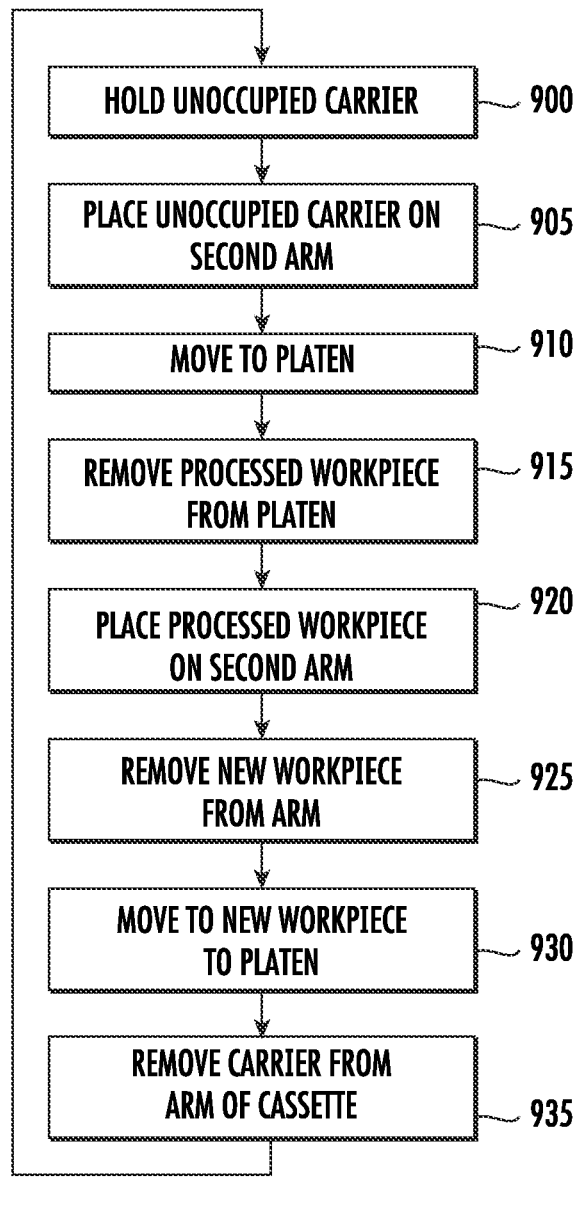
FIG. 9 shows the sequence of operations performed by the second robot according to another embodiment.

FIG. 8 shows a sequence of operations that may be performed by the second robot 190 according to one embodiment.

In steady state, as shown in Box 800, the second robot end effector 191 of the second robot 190 may be holding an unoccupied carrier 155, waiting for the arrival of the cassette 110. The cassette 110 may arrive at the upper chamber with a new workpiece 2 and its associated carrier disposed on one arm 120. The second arm of the cassette 110 may be empty. The second robot 190 may extend the second robot end effector 191 into the cassette so as to place the unoccupied carrier 155 on the second arm, as shown in Box 805. The cassette 110 may then move upward so that the unoccupied carrier 155 rests on the carrier support posts 130. The second robot end effector 191 is then retracted. The second robot end effector 191 is then extended between the new workpiece 2 and its associated carrier. The cassette 110 then moves downward allowing the new workpiece 2 to be disposed on the second robot end effector 191, as shown in Box 810. Note that the carrier 150 remains on the first arm at this time.

The second robot 190 may then move the new workpiece 2 to the orientation station 200, as shown in Box 815. The second robot 190 may then move to the platen 210 (Box 820) and remove a processed workpiece 3 from the platen 210 (Box 825). The second robot then moves to the workpiece transfer apparatus 100 and extends the second robot end effector 191 toward the second arm, where the unoccupied carrier 155 is located. The cassette 110 is then moved upward, such that the processed workpiece 3 rests on the workpiece support posts 140, as shown in Box 830. The second robot end effector 191 is then retracted. In some embodiments, the second robot 190 then moves back to the orientation station 200 and removes the new workpiece 2, which has been aligned, as shown in Box 835. The aligned workpiece is then moved by the second robot 190 to the platen 210 (Box 840). The aligned workpiece may then be processed by the semiconductor processing equipment 30. In that way, the aligned workpiece may be subject to implantation, deposition, etching, planarization or some other process. Finally, the second robot 190 may return to the workpiece transfer apparatus 100 and remove the carrier 150 that is disposed on the first arm, as shown in Box 845.

In this way, the second arm is always used for processed workpieces and the first arm is always used for new workpieces.

Note in some embodiments, the second robot 190 may not move the aligned workpiece to the platen. In these embodiments, Box 845 may directly follow Box 830. Further, in some embodiments, the sequence of operations may be modified.

In another embodiment, the orientation station 200 may not be used. In this configuration, the second robot 190 is used to transfer workpieces between the workpiece transfer apparatus 100 and the platen 210. That sequence is described below.

In steady state, the second robot end effector 191 of the second robot 190 may be holding an unoccupied carrier 155, waiting for the arrival of the cassette 110, as shown in Box 900. The cassette 110 may arrive at the upper chamber with a new workpiece 2 and its associated carrier disposed on one arm 120. The second arm of the cassette 110 may be empty. The second robot 190 may extend the second robot end effector 191 into the cassette 110 so as to place the unoccupied carrier 155 on the second arm (Box 905). The cassette 110 may then move upward so that the unoccupied carrier 155 rests on the carrier support posts 130. The second robot end effector 191 is then retracted. The second robot 190 then moves the platen 210 (Box 910) to remove a processed workpiece 3 from the platen 210 (Box 915). That processed workpiece 3 is then returned to the workpiece transfer apparatus 100.

The second robot 190 then extends the second robot end effector 191 toward the second arm, where the unoccupied carrier 155 is located. The cassette 110 is then moved upward, such that the processed workpiece 3 rests on the workpiece support posts 140, as shown in Box 920. The second robot end effector 191 is then retracted.

The second robot end effector 191 is then extended between the new workpiece 2 and its associated carrier. The cassette 110 then moves downward allowing the new workpiece 2 to be disposed on the second robot end effector 191 (Box 925). The second robot 190 may then move the new workpiece 2 to the platen 210, as shown in Box 930. The new workpiece 2 may then be processed by the semiconductor processing equipment 30. In that way, the new workpiece 2 may be subject to implantation, deposition, etching, planarization or some other process. Finally, the second robot 190 may return to the workpiece transfer apparatus 100 and remove the carrier 150 that is disposed on the first arm (Box 935). Note that, in some embodiments, the sequence of operations may be modified.

Thus, note that in some embodiments, two different robots interact with a workpiece transfer apparatus 100. The first robot may only transport workpieces having a predetermined size. Thus, when smaller workpiece are used, the first robot utilizes the carrier. Note however, that the second robot is able to transport workpieces of different sizes and therefore does not use the carrier to transport the workpieces to the semiconductor processing equipment 30. The carrier 150 and cassette 110 described herein allow this configuration to operate.

The present apparatus has many advantages. The cassette and carrier combine to create a solution that is applicable to workpieces of varying sizes without redesign of any other components. Specifically, a carrier is designed for each smaller workpiece size. These carriers are all operable with the cassette, which includes support posts for both the workpiece and the carrier. Additionally, this configuration allows other components in the semiconductor processing system to remain unchanged, since the carrier is the same size as the standard workpiece.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A workpiece transfer apparatus, comprising:
a cassette, having an arm and at least one additional arm each having a plurality of carrier support posts and a plurality of workpiece support posts that are taller than the plurality of carrier support posts, wherein the carrier support posts extend upward from the arm such that there is a gap between a carrier and the arm when the carrier is placed on the carrier support posts.

2. A workpiece transfer system, comprising:
the workpiece transfer apparatus of claim 1; and
a carrier, adapted to hold a workpiece, wherein the carrier is larger than the workpiece, and wherein the carrier comprises holes passing therethrough corresponding to locations of each of the plurality of workpiece support posts, such that when the carrier is placed on the plurality of carrier support posts, the plurality of workpiece support posts extend above the carrier to support the workpiece.

3. The workpiece transfer system of claim 2, wherein the carrier comprises alignment tabs on a top surface, so as to retain the workpiece in a fixed location.

4. The workpiece transfer system of claim 2, wherein the carrier is disk shaped.

5. The workpiece transfer system of claim 4, wherein the carrier has a dimension equal to a largest workpiece supported by the arm.

6. The workpiece transfer system of claim 2, wherein the carrier is made from silicon.

7. The workpiece transfer system of claim 2, wherein the carrier is made from glass.

8. A system for transporting and processing a workpiece, comprising:

a first robot having a first end effector;

a workpiece transfer apparatus, comprising a cassette, having an arm having a plurality of carrier support posts and a plurality of workpiece support posts that are taller than the plurality of carrier support posts;

a carrier, adapted to hold a workpiece, wherein the carrier is larger than the workpiece, and wherein the carrier comprises holes passing therethrough corresponding to locations of each of the plurality of workpiece support posts, such that when the carrier is placed on the plurality of carrier support posts, a gap exists between the carrier and the cassette, and the plurality of workpiece support posts extend above the carrier to support the workpiece; and a second robot having a second robot end effector, wherein the first robot and the second robot place and remove workpieces from the workpiece transfer apparatus.

9. The system of claim 8, wherein the first end effector has a different shape than the second robot end effector, and the plurality of workpiece support posts are positioned on the arm such that the first end effector and the second robot end effector are capable of placing and removing the workpiece from the arm without contacting the plurality of workpiece support posts.

10. The system of claim 8, wherein the first end effector accesses the workpiece from a different direction than the second robot end effector, and the plurality of workpiece support posts are positioned on the arm such that the first end effector and the second robot end effector are capable of placing and removing the workpiece from the arm without contacting the plurality of workpiece support posts.

11. The system of claim 8, further comprising semiconductor processing equipment, accessible by the second wherein the semiconductor robot, processing equipment comprises a platen.

12. The system of claim 11, wherein the cassette has a second arm, comprising the plurality of carrier support posts and the plurality of workpiece support posts.

13. The system of claim 12, wherein the first robot has a second end effector, and wherein the first robot removes a first carrier with a processed workpiece disposed thereon from the arm using the first end effector and places a second carrier with an unprocessed workpiece disposed thereon on the second arm using the second end effector.

14. The system of claim 12, further comprising an orientation station, wherein, during steady state operation, the second robot performs a sequence of operations, comprising:

retaining an unoccupied carrier with the second robot end effector waiting for the cassette to arrive;

placing the unoccupied carrier on the second arm;

removing a new workpiece from the arm and transferring the new workpiece to the orientation station;

moving to the platen;

removing a processed workpiece from the platen;

returning the processed workpiece to the second arm; and removing a carrier disposed on the arm.

15. The system of claim 14, wherein before removing the carrier disposed on the arm, the sequence of operations further comprises:

moving to the orientation station;

removing an aligned workpiece; and moving the aligned workpiece to the platen.

16. The system of claim 12, wherein, during steady state operation, the second robot performs a sequence of operations, comprising:

retaining an unoccupied carrier with the second robot end effector waiting for the cassette to arrive;

placing the unoccupied carrier on the second arm;

moving to the platen;

removing a processed workpiece from the platen;

returning the processed workpiece to the second arm;

removing a new workpiece from the arm and transferring the new workpiece to the platen; and removing a carrier disposed on the arm.

17. A system for transporting and processing a workpiece, comprising:

a first robot;

a workpiece transfer apparatus, comprising a cassette, having an arm having a plurality of carrier support posts and a plurality of workpiece support posts that are taller than the plurality of carrier support posts;

a carrier, adapted to hold a workpiece, wherein the carrier is larger than the workpiece, and wherein the carrier comprises holes passing therethrough corresponding to locations of each of the plurality of workpiece support posts;

semiconductor processing equipment; and a second robot, wherein the first robot utilizes the carrier to transport workpieces to and from the workpiece transfer apparatus and the second robot transports workpieces to and from the semiconductor processing equipment without the carrier by lifting the workpiece from the workpiece transfer apparatus using an end effector directed to a gap located between the carrier and the workpiece, which is supported by the workpiece support posts.

18. The system of claim 17, wherein the carrier is disk shaped.

19. The system of claim 18, wherein the carrier has a dimension equal to a largest workpiece used in the workpiece transfer apparatus.

20. A workpiece transfer system, comprising:

a workpiece transfer apparatus comprising:

a cassette, having an arm having a plurality of carrier support posts and a plurality of workpiece support posts that are taller than the plurality of carrier support posts; and a carrier, which is disk shaped and adapted to hold a workpiece, wherein the carrier is larger than the workpiece, and wherein the carrier comprises holes passing therethrough corresponding to locations of each of the plurality of workpiece support posts, such that when the carrier is placed on the plurality of carrier support posts, the plurality of workpiece support posts extend above the carrier to support the workpiece.

21. The workpiece transfer system of claim 20, wherein the carrier comprises alignment tabs on a top surface, so as to retain the workpiece in a fixed location.

22. The workpiece transfer system of claim 20, wherein the carrier has a dimension equal to a largest workpiece supported by the arm.

23. The workpiece transfer system of claim 20, wherein the carrier is made from silicon or glass.

\* \* \* \* \*